United States Patent
Chen et al.

(10) Patent No.: US 11,682,588 B2
(45) Date of Patent: Jun. 20, 2023

(54) EPITAXIAL SOURCE/DRAIN AND METHODS OF FORMING SAME

(71) Applicant: Taiwan Semiconductor Manufacturing Co., Ltd., Hsinchu (TW)

(72) Inventors: Cheng-Long Chen, Hsin-Chu (TW); Yasutoshi Okuno, Hsinchu (TW); Pang-Yen Tsai, Hsin-Chu Hsian (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 176 days.

(21) Appl. No.: 17/347,281

(22) Filed: Jun. 14, 2021

(65) Prior Publication Data

US 2021/0313236 A1    Oct. 7, 2021

Related U.S. Application Data

(62) Division of application No. 16/535,701, filed on Aug. 8, 2019, now Pat. No. 11,037,837.

(60) Provisional application No. 62/764,845, filed on Aug. 15, 2018.

(51) Int. Cl.
| | |
|---|---|
| *H01L 21/8238* | (2006.01) |
| *H01L 27/092* | (2006.01) |
| *H01L 29/78* | (2006.01) |
| *H01L 29/08* | (2006.01) |
| *H01L 21/768* | (2006.01) |
| *H01L 21/762* | (2006.01) |
| *H01L 29/66* | (2006.01) |
| *H01L 29/167* | (2006.01) |

(52) U.S. Cl.
CPC ......... *H01L 21/823814* (2013.01); *H01L 21/76224* (2013.01); *H01L 21/76832* (2013.01); *H01L 21/823821* (2013.01); *H01L 21/823878* (2013.01); *H01L 27/0924* (2013.01); *H01L 29/0847* (2013.01); *H01L 29/167* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |

(Continued)

*Primary Examiner* — Evren Seven
(74) *Attorney, Agent, or Firm* — Haynes and Boone, LLP

(57) ABSTRACT

A method for forming an epitaxial source/drain structure in a semiconductor device includes providing a substrate having a plurality of fins extending from the substrate. In some embodiments, a liner layer is formed over the plurality of fins. The liner layer is patterned to expose a first group of fins of the plurality of fins in a first region. In some embodiments, a first epitaxial layer is formed over the exposed first group of fins and a barrier layer is formed over the first epitaxial layer. Thereafter, the patterned liner layer may be removed. In various examples, a second epitaxial layer is selectively formed over a second group of fins of the plurality of fins in a second region.

20 Claims, 5 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2016/0099150 A1 | 4/2016 | Tsai et al. |
| 2018/0204840 A1 | 7/2018 | Peng |
| 2020/0020774 A1 | 1/2020 | Lee et al. |
| 2020/0286792 A1 | 9/2020 | St. Amour et al. |
| 2020/0286891 A1 | 9/2020 | Subramanian et al. |

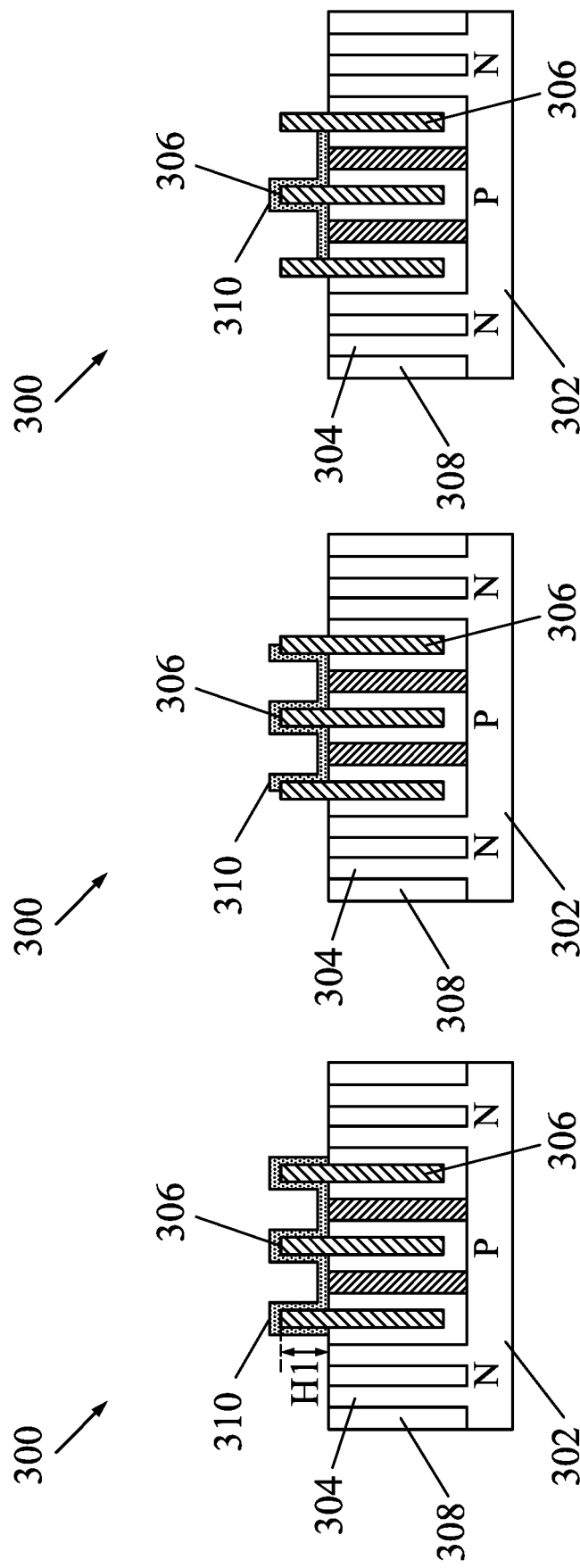

EPITAXIAL SOURCE/DRAIN AND METHODS OF FORMING SAME

CROSS-REFERENCE TO RELATED APPLICATION

This application is a divisional of U.S. patent application Ser. No. 16/535,701, filed Aug. 8, 2019, which claims the benefit of U.S. Provisional Application No. 62/764,845, filed Aug. 15, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In at least some examples, FinFET fabrication may include the use of two photolithography processes, each requiring its own mask, to define N-type epitaxial source/drain regions and P-type epitaxial source/drain regions, respectively. However, for advanced semiconductor processing, the cost, quality, and performance requirements for masks, and for photolithography processes in general, is becoming more and more critical. Thus, each additional mask used for a given process adds to process cost and complexity. Also, in at least some current examples, using separate photolithography processes, and separate masks, to define N-type epitaxial source/drain regions and P-type epitaxial source/drain regions may also require the deposition and removal of additional masking layers (e.g., such as dielectric isolation layers), which can lead to epitaxial layer loss (e.g., of the N-type and P-type source/drain regions). Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C, 4, and 5 provide cross-sectional views of an exemplary device fabricated according to one or more steps of the method of FIG. 2.

DETAILED DESCRIPTION

Figure 1:
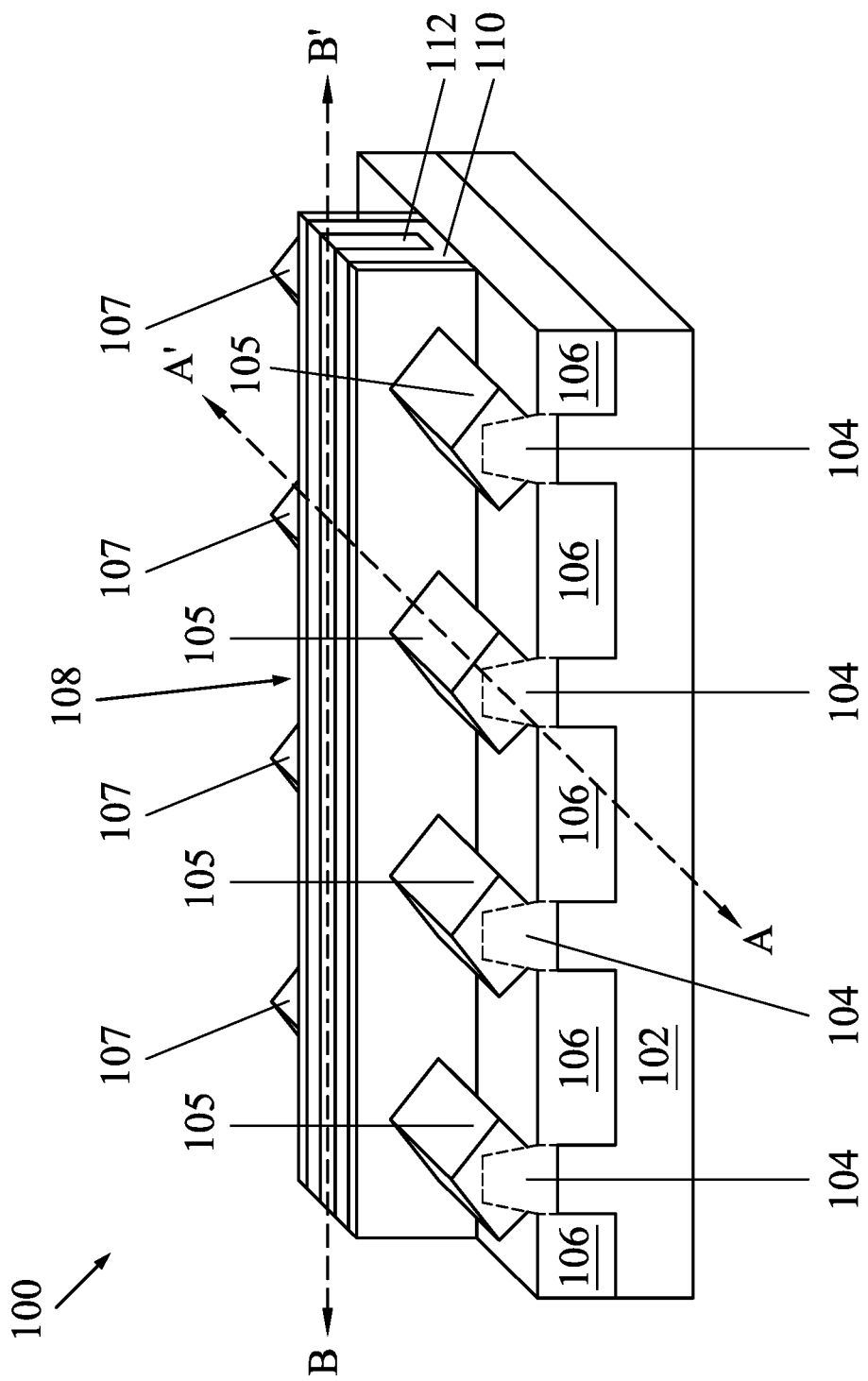
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate 102 may include various layers, including conductive or insulating layers formed on a semiconductor substrate. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include an SOI structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2/V$-s and a hole mobility of around 480 $cm^2/V$-s, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having a gate dielectric layer 110, and a metal layer 112 formed over the gate dielectric layer. In some embodiments, the gate dielectric layer 110 may include an interfacial layer formed over the channel region of the fin 104 and a high-K dielectric layer over the interfacial layer. The interfacial layer of the gate dielectric layer 110 may include a dielectric material such as silicon oxide layer ($SiO_2$) or silicon oxynitride (SiON). The high-K dielectric layer of the gate dielectric layer 110 may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer 110 may include silicon dioxide or another suitable dielectric. The gate dielectric layer 110 may be formed by chemical oxidation, thermal oxidation, atomic layer deposition (ALD), physical vapor deposition (PVD), chemical vapor deposition (CVD), and/or other suitable methods. The metal layer 112 may include a conductive layer such as W, TiN, TaN, WN, Re, Ir, Ru, Mo, Al, Cu, Co, Ni, combinations thereof, and/or other suitable compositions. In some embodiments, the metal layer 112 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 112 may provide a gate electrode for the FinFET device 100, including both N-type and P-type FinFET devices 100. In some embodiments, the metal layer 112 may alternately include a polysilicon layer. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As discussed above, fabrication of a FinFET device (e.g., the FinFET device 100) may include the use of two photolithography processes, each requiring its own mask, to define N-type epitaxial source/drain regions and P-type epitaxial source/drain regions (e.g., such as source/drain regions 105, 107), respectively. For example, a first dielectric isolation layer (e.g., SiN) may initially be formed over fins in both an N-type and a P-type source/drain region. A first source/drain photolithography and etch process may then be performed to pattern the first dielectric isolation layer by removing the first dielectric isolation layer in a P-type source/drain region, thereby exposing one or more fins in the P-type source/drain region. An epitaxial P-type source/drain structure may then be formed over the one or more exposed fins in the P-type source/drain region. In some cases, prior to forming the epitaxial P-type source/drain structure, a fin recess process may be performed to recess the one or more exposed fins in the P-type source/drain region, and the epitaxial P-type source/drain structure may then be formed over the recessed fins in the P-type source/drain region. Thereafter, the first dielectric isolation layer remaining (e.g., in the N-type source/drain region) is removed.

After removing the first dielectric isolation layer, a second dielectric isolation layer (e.g., SiN) may be formed over fins in the N-type source/drain region and over the epitaxial P-type source/drain structure previously formed in the P-type source/drain region. A second source/drain photolithography and etch process may then be performed to pattern the second dielectric isolation layer by removing the second dielectric isolation layer in the N-type source/drain region, thereby exposing one or more fins in the N-type source/drain region. An epitaxial N-type source/drain structure may then be formed over the one or more exposed fins in the N-type source/drain region. In some cases, prior to forming the epitaxial N-type source/drain structure, a fin recess process may be performed to recess the one or more exposed fins in the N-type source/drain region, and the epitaxial N-type source/drain structure may then be formed over the recessed fins in the N-type source/drain region. Thereafter, the second dielectric isolation layer remaining (e.g., in the P-type source/drain region) is removed.

The use of two photolithography processes, and thus two masks, to form the N-type and P-type epitaxial source/drain regions, as described above, has several disadvantages. For example, as semiconductor processing techniques continue to advance, the cost, quality, and performance requirements for masks, and for photolithography processes in general, is becoming more and more critical. Thus, each additional mask used for a given process adds to process cost and complexity. Also, in at least some current examples, using separate photolithography processes, and separate masks, to define N-type and P-type epitaxial source/drain regions may also require the deposition and removal of additional masking layers (e.g., such as the first and second dielectric isolation layers, discussed above), which can lead to epitaxial layer loss (e.g., of the epitaxial P-type source/drain structure and/or of the epitaxial N-type source/drain structure). Further, in some examples, top surfaces of the epitaxial P-type source/drain structure and the N-type source/drain structure may be significantly different from each other (e.g., such as having different heights), adding to process complexity and potentially degrading device reliability. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods of forming an epitaxial source/drain structure. In some embodiments, a single photolithography process, and thus a single mask, is used to form both N-type epitaxial source/drain regions and P-type epitaxial source/drain regions. In some examples, an N-type source/drain photolithography process may be used to protect a P-type source/drain region, while exposing an N-type source/drain region, and an epitaxial N-type source/drain structure may be formed within the exposed N-type source/drain region. In some cases, a highly-doped N-type layer may be formed on a surface of the epitaxial N-type source/drain structure in the N-type source/drain region. Thereafter, and without an additional photolithography process, an epitaxial P-type source/drain structure may be formed within the P-type source/drain region. In particular, and as a result of the highly-doped N-type layer formed on the surface of the epitaxial N-type source/drain structure, the epitaxial P-type source/drain structure will not grow on the highly-doped N-type layer in the N-type source/drain region, thereby providing source/drain epitaxial growth selectivity between the N-type and P-type source/drain regions. After forming the epitaxial P-type source/drain structure within the P-type source/drain region, the highly-doped N-type layer may be removed from the surface of the N-type source/drain structure. By using a single mask to form both N-type and P-type epitaxial source/drain regions, embodiments of the present disclosure provide for a reduction in the cost and complexity of forming epitaxial source/drain regions. In addition, the simplified process of forming epitaxial source/drain regions disclosed herein is accomplished with the deposition and removal of fewer masking layers (e.g., such as dielectric isolation layers), for example as compared to at least some existing processes, which provides for reduced epitaxial layer loss. Additional embodiments and advantages are discussed below and/or will be evident to those skilled in the art in possession of this disclosure.

Figure 2:
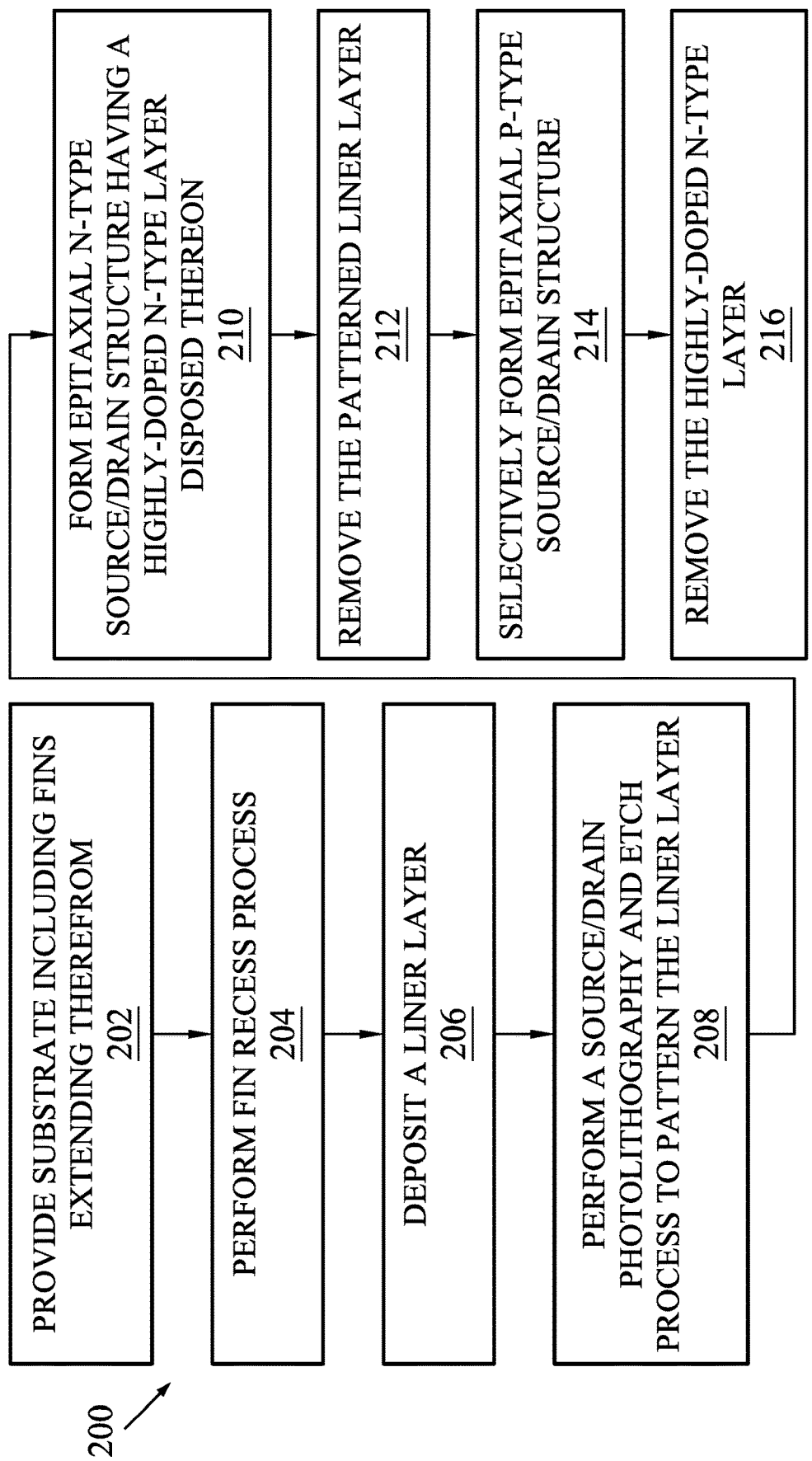
FIG. 2 is a flow chart of a method of fabricating a semiconductor device using a single photolithography process, and thus a single mask, to form both the N-type and P-type epitaxial source/drain regions, in accordance with some embodiments.

Referring now to FIG. 2, illustrated is a method 200 of fabricating a semiconductor device (e.g., such as a FinFET device) using a single photolithography process, and thus a single mask, to form both the N-type and P-type epitaxial source/drain regions, in accordance with one or more embodiments. In some embodiments, the method 200 may be used to fabricate the device 100, described above with reference to FIG. 1. Thus, one or more aspects discussed above with reference to the device 100 may also apply to the method 200. Additionally, FIGS. 3A, 3B, 3C, 4, and 5 provide cross-sectional views of an exemplary device 300 fabricated according to one or more steps of the method 200 of FIG. 2.

It is understood that parts of the method 200 and/or the semiconductor device 300 may be fabricated by a well-known CMOS technology process flow, and thus some processes are only briefly described herein. In addition, as described above, the device 300 may share aspects of the device 100, thus some aspects and/or processes of the device 300 are only discussed briefly for purposes of clarity in understanding. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

In various embodiments, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Referring now to the method 200, the method 200 begins at block 202 where a substrate including fins extending therefrom is provided. Referring to the example of FIG. 3A, illustrated therein is a FinFET device 300 which includes a substrate 302, fin elements 304 extending from the substrate 302, and isolation regions 308. The substrate 302 may be substantially similar to the substrate 102 discussed above with reference to FIG. 1. The fins 304 and isolation regions 308 may also be substantially similar to the fin elements 104 and isolation regions 106, also described above with reference to the device 100 of FIG. 1.

In various embodiments, the FinFET device 300 may also include one or more hybrid fins 306 formed within a P-type region, and at boundary between the P-type region and an N-type region. In some examples, the hybrid fins 306 may be formed after the fins 304. In some embodiments, the isolation regions 308 interposing the fins 304 may be patterned (e.g., using a photolithography and etching process) to form trenches within the isolation regions 308 and within which the hybrid fins 306 will be formed. Alternatively, the dielectric material used to form the isolation regions 308 may be deposited conformally over the fins 304, such that the conformal deposition itself forms trenches within the isolation regions 308 and between adjacent fins 304, within which the hybrid fins 306 will be formed. Regardless of how they are formed, the trenches within the isolation regions 308 may be filled with one or more isolation materials to form the hybrid fins 306. In some cases, the isolation material used to form the hybrid fins 306 may include a layer of a low-K (LK) material including SiCN, SiOC, SiOCN, or another low-K material (e.g., with a dielectric constant 'k'<7), a layer of a high-K (HK) material including $HfO_2$, $ZrO_2$, HfAlOx, $HfSiO_x$, $Al_2O_3$, or another high-K material (e.g., with a dielectric constant 'k'>7), or a combination thereof. In some embodiments, the isolation material used to form the hybrid fins 306 may include a first layer and a second layer formed over the first layer, where the first layer includes a LK material (such as a LK material noted above), and where the second layer includes a HK material (such as a HK material noted above). Thus, in some cases, the hybrid fins 306 may include a bi-layer dielectric material, where an upper layer of the hybrid fin 306 is HK and where a lower layer of the hybrid fin 306 is LK. Alternatively, in some cases, the upper layer of the hybrid fins 306 may be LK and the lower layer of the hybrid fins 306 may be HK. In some examples, a ratio of the upper layer to the lower layer, that is a HK/LK ratio, is about 1/20-20/1. In some embodiments, hybrid fins 306 may effectively prevent the undesirable lateral merging of the source/drain epi-layers formed on adjacent fins 304, as discussed in more detail below.

The method 200 proceeds to block 204 where a fin recess process is performed. In some embodiments, and referring to FIG. 3A, a fin recess process may be performed to recess the fins 304 in a source/drain region of the FinFET device 300. In some embodiments, the recessing process may include a dry etching process, a wet etching process, and/or a combination thereof. In some embodiments, a recessing depth is controlled (e.g., by controlling an etching time) to result in a desired height difference 'H1' between a top surface of the fins 304 and a top surface of the hybrid fins 306.

The method 200 proceeds to block 206 where a liner layer is deposited. For example, after the fin recess process of block 204 and still with reference to FIG. 3A, a liner layer 310 may be deposited over the device 300. In some cases, the liner layer 310 includes an oxide layer. Further, in various embodiments, the liner layer 310 may include silicon oxide, silicon nitride, silicon oxynitride, FSG, a LK dielectric, combinations thereof, and/or other suitable material. Thus, in various examples, the liner layer 310 may in some cases be referred to as a dielectric isolation layer. In some cases, the liner layer 310 may be composed of the same material as the isolation regions 308. Alternatively, the liner layer 310 may be composed of a different material than the isolation regions. Whether composed of the same or different materials, in various embodiments the liner layer 310 and the isolation regions 308 may both include dielectric layers. In some embodiments, the liner layer 310 has a thickness equal to about 6-10 nm. By way of example, the thickness of the liner layer 310 may be chosen to effectively resist a cleaning process that is performed prior to formation of the epitaxial N-type source/drain structure, discussed below. By using a single dielectric isolation layer (e.g., the liner layer 310), as compared to the multiple dielectric isolation layers as in some existing processes, embodiments of the present disclosure provide for reduced epitaxial layer loss, as previously noted.

After depositing the liner layer (block 206), the method 200 proceeds to block 208 where a source/drain photolithography and etch process is performed to pattern the liner layer. In some embodiments, the source/drain photolithography and etch process includes an N-type source/drain photolithography process that is performed using a mask and which is used to pattern the liner layer 310 by removing the liner layer 310 in an N-type source/drain region. By way of example, the source/drain photolithography and etch process may include forming a photoresist layer (resist) over the liner layer 310, exposing the resist to a pattern defined by the mask, performing post-exposure bake processes, and developing the resist to form a resist masking element. The resist masking element may then be used to protect the liner layer 310 in a P-type source/drain region while an etch process is used to remove the exposed liner layer 310 in the N-type source/drain region, as shown in the example of FIG. 3A. The etching process may include a dry etch, a wet etch, and/or other suitable etching process. In various embodiments, the etching process used to remove the liner layer 310 in the N-type source/drain region may also expose one or more recessed fin elements 304 in the N-type source/drain region. It is noted that in the example of FIG. 3A, the hybrid fins 306 remain covered by the liner layer 310 after the etch process of block 208. However, in some embodiments and as shown in the example of FIG. 3B, the etch process of block 208 may remove the liner layer 310 from at least some of the hybrid fins 306. In some further embodiments, the etch process of block 208 may remove the liner layer 310 from a top portion of the hybrid fins 306, as shown in the example of FIG. 3C. Regardless of whether the hybrid fins 306 remain covered by the liner layer 310 (FIG. 3A), are partially covered by the liner layer 310 (FIG. 3B), or have exposed top portions (FIG. 3C), the fin elements 304 in the P-type source/drain region remain covered and protected by the liner layer 310, after the etch process of block 208. For purposes of the discussion that follows, it is assumed that the hybrid fins 306 remain at least partially covered by the liner layer 310 (FIG. 3B) after the etch process of block 208.

Figure 4:
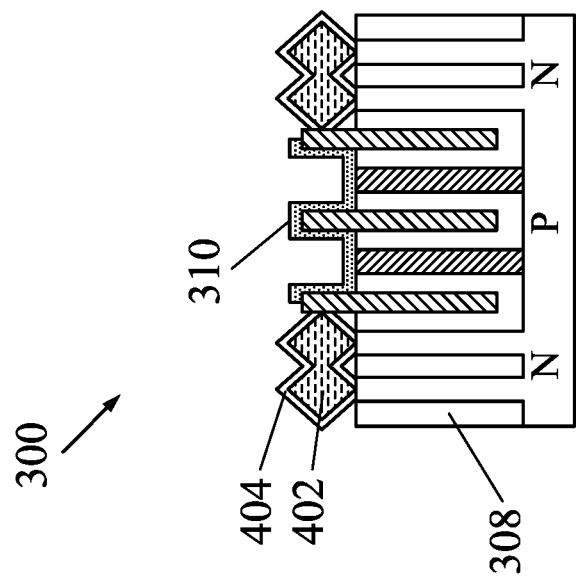

The method 200 proceeds to block 210 where an epitaxial N-type source/drain structure, having a highly-doped N-type layer disposed thereon, is formed. With reference to FIG. 4, an epitaxial N-type source/drain structure 402 may be formed in, on, and/or surrounding the one or more exposed fin elements 304 in the N-type source/drain region, and a highly-doped N-type layer 404 may be formed on the N-type source/drain structure 402. In some embodiments, formation of the epitaxial N-type source/drain structure 402 and the highly-doped N-type layer 404 may include a cleaning process (e.g., a remote plasma dry cleaning), an N-type epitaxial growth process (e.g., to form the epitaxial N-type source/drain structure 402), and growth of an in-situ highly-doped N-type layer (e.g., to form a highly-doped N-type layer 404). In some embodiments, the epitaxial N-type source/drain structure 402 and/or the highly-doped N-type layer 404 may include a phosphorus doped layer, an arsenic doped layer, or another appropriate doped layer. In some embodiments, formation of the epitaxial N-type source/drain structure 402 and/or the highly-doped N-type layer 404 may include formation of a SiP layer, a SiCP layer, a SiAs layer, or a combination thereof. In some cases, the highly-doped N-type layer 404 may have a phosphorus doping concentration greater than or equal to about $1.03 \times 10^{22}$ atoms/cm$^3$.

Figure 5:
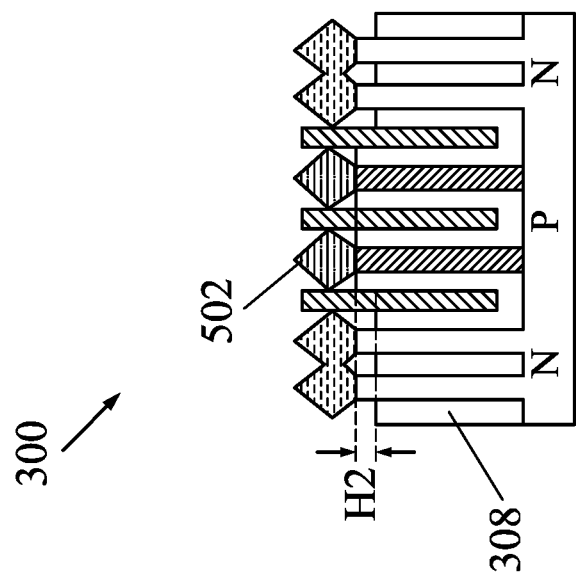

After forming the epitaxial N-type source/drain structure 402 and the highly-doped N-type layer 404 (block 210), the method 200 proceeds to block 212 where the remaining patterned liner layer 310 may be removed (e.g., from the P-type source/drain region) to expose one or more fin elements 304 in the P-type source/drain region. The method 200 proceeds to block 214 where an epitaxial P-type source/drain structure is selectively formed. With reference to FIG. 5, an epitaxial P-type source/drain structure 502 may be formed in, on, and/or surrounding the one or more exposed fin elements 304 in the P-type source/drain region. In some embodiments, formation of the epitaxial P-type source/drain structure 502 may include a cleaning process (e.g., a remote plasma dry cleaning) and a P-type epitaxial growth process (e.g., to form the epitaxial P-type source/drain structure 502). In some embodiments, the P-type epitaxial growth process includes formation of a SiGe layer, a Ge layer, a boron doped SiGe layer (SiGe:B), or a combination thereof. In particular, and as a result of the highly-doped N-type layer 404 on a surface of the N-type source/drain structure 402, the deposited P-epi layer (e.g., SiGe:B used for the P-type source/drain structure 502) will not grow on the highly-doped N-type layer 404, thereby providing source/drain epitaxial growth selectivity between the N-type and P-type source/drain regions. Thus, in some examples, the highly-doped N-type layer 404 may be referred to as a barrier layer. It is also noted that in various embodiments, the hybrid fins 306 may effectively prevent the undesirable lateral merging of the epitaxial P-type source/drain structures 502 formed on adjacent fins 304 in the P-type source/drain region.

Thereafter, the method 200 proceeds to block 216 where the highly-doped N-type layer is removed. For example, with reference to FIG. 5, the highly-doped N-type layer 404 may be removed from the surface of the N-type source/drain structure 402 (e.g., by an etching process). In some embodiments, removal of the highly-doped N-type layer 404 may also etch at least some of the underlying N-type source/drain structure 402, resulting in epitaxial layer loss of the N-type source/drain structure 402. In some examples, removal of the highly-doped N-type layer 404 may etch the underlying N-type source/drain structure 402 by about 1-2 nm or by about 5% of the thickness of the N-type source/drain structure 402. In some cases, removal of the highly-doped N-type layer 404 from the surface of the N-type source/drain structure 402 may also cause etching of the underlying isolation region 308 in the N-type source/drain region, as shown in FIG. 5. As a result, the N-type source/drain structure 402 may be disposed a height 'H2' above the isolation region 308 in the N-type source/drain region. Further, while removal of the highly-doped N-type layer 404 may etch the isolation region 308 in the N-type source/drain region, the isolation region in the P-type source/drain region may remain substantially unetched during removal of the highly-doped N-type layer 404. Thus, in various examples, isolation region 308 in the P-type source/drain region may be disposed higher than the isolation region 308 in the N-type source/drain region, for example, by about the height 'H2'. In some cases, the height 'H2' may be equal to about 3-10 nm. In various examples, the height 'H2' may be determined at least partly by the etch process (e.g., etch chemistry, etch time, etc.) required to adequately remove the highly-doped N-type layer 404 from the N-type source/drain structure 402. It is also noted that in various embodiments, the epitaxial P-type source/drain structures 502 and the epitaxial N-type source/drain structures 402 may be disposed at substantially the same height with respect to each other, thereby simplifying device processing and improving device reliability. The method 200 may then proceed to perform subsequent processing of the device 300 such as forming contacts and interconnects, as well as other types of semiconductor processes.

In various examples, one or more of the features shown and described above may be detectable on a final device structure. For instance, in some cases, the level of the isolation region 308 in N-type region may be lower (e.g., about 3-10 nm lower than in the P-type region) because the N-type region may experience dry etch loss during removal of the highly-doped N-type layer 404 from the surface of the N-type source/drain structure 402, as well as loss from the second clean process. In some examples, the P-type source/drain structure 502 remains in contact with the isolation region 308 in the P-type region, while the N-type source/drain structure 402 does not contact the isolation region 308 in the N-type region, because of the etching of the isolation region 308 in the N-type region, as discussed above. In various embodiments, the N-type source/drain structures 402 formed on adjacent fins 304 are merged, while the P-type source/drain structures 502 formed on adjacent fins 304 are prevented from merging by the hybrid fins 306. In some embodiments, and because of the epitaxial layer loss of the N-type source/drain structure 402 resulting from removal of the highly-doped N-type layer 404, the N-type source/drain structure 402 may be smaller than the P-type source/drain structure 502. In some embodiments, a recess depth/fin sidewall spacer height difference between the N-type and P-type source/drain regions may be equal to about 0-3 nm. Thus, various features formed as result of the process disclosed herein may be detectable on the final device structure.

Figure 6:
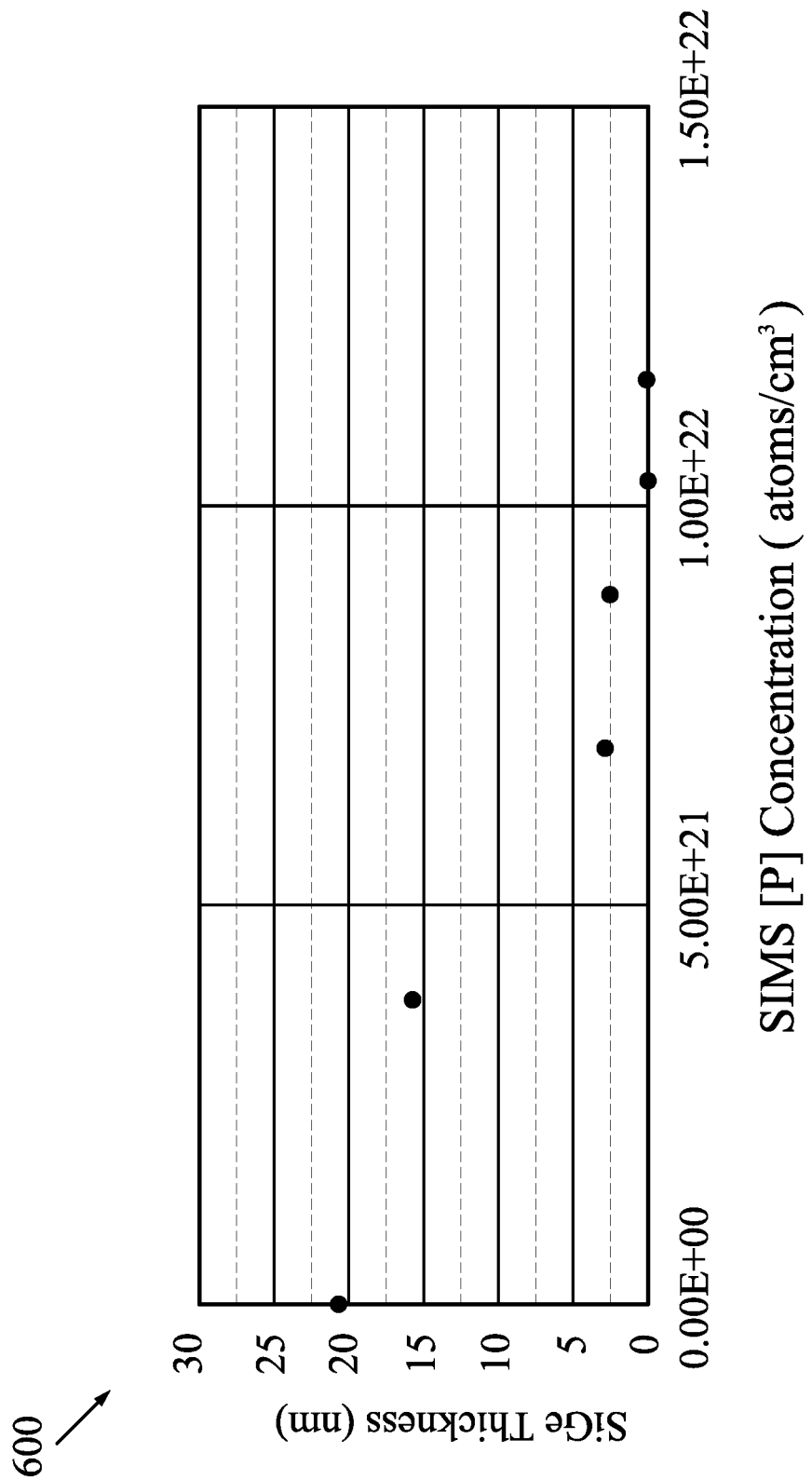
FIG. 6 shows a graph illustrating SiGe thickness as a function of [P] doping concentration of an underlying layer.

As noted above, the highly-doped N-type layer 404 (e.g., such as a highly phosphorus-doped SiP layer) on the surface of the N-type source/drain structure 402 helps to prevent growth of a P-type epi layer (e.g., SiGe:B) in the N-type region, thereby providing source/drain epitaxial growth selectivity between the N-type and P-type source/drain regions. It is noted however, that to achieve such selectivity, the phosphorus doping concentration [P] of the N-type layer 404 should be equal to or greater than a threshold value. In some examples, the threshold value is about $1.03 \times 10^{22}$ atoms/cm$^3$. As a further illustration, FIG. 6 shows a graph 600 illustrating SiGe thickness as a function of [P] doping concentration of an underlying layer (e.g., of the N-type layer 404). In particular, the graph 600 shows a SiGe layer thickness on a [P] doped SiP layer, such as the N-type layer 404, as a function of the [P] doping concentration of the SiP layer (or more generally, of the N-type layer 404). As shown, for [P] doping concentrations less than the threshold value of about $1.03 \times 10^{22}$ atoms/cm$^3$, there is a measurable layer of SiGe that grows on the doped SiP layer. However, for [P] doping concentrations equal to or greater than the threshold value of about $1.03 \times 10^{22}$ atoms/cm$^3$, there is no SiGe growth on the doped SiP layer.

The various embodiments described herein offer several advantages over the existing art. It will be understood that not all advantages have been necessarily discussed herein, no particular advantage is required for all embodiments, and other embodiments may offer different advantages. For example, embodiments discussed herein include methods of forming an epitaxial source/drain structure. In some embodiments, a single photolithography process, and thus a single mask, is used to form both N-type epitaxial source/drain regions and P-type epitaxial source/drain regions. In some examples, an N-type source/drain photolithography process may be used to protect a P-type source/drain region, while exposing an N-type source/drain region, and an epitaxial N-type source/drain structure may be formed within the exposed N-type source/drain region. In some cases, a highly-doped N-type layer may be formed on a surface of the epitaxial N-type source/drain structure in the N-type source/drain region. Thereafter, and without an additional photolithography process, an epitaxial P-type source/drain structure may be formed within the P-type source/drain region. In particular, and as a result of the highly-doped N-type layer formed on the surface of the epitaxial N-type source/drain structure, the epitaxial P-type source/drain structure will not grow on the highly-doped N-type layer in the N-type source/drain region, thereby providing source/drain epitaxial growth selectivity between the N-type and P-type source/drain regions. After forming the epitaxial P-type source/drain structure within the P-type source/drain region, the highly-doped N-type layer may be removed from the surface of the N-type source/drain structure. By using a single mask to form both N-type and P-type epitaxial source/drain regions, embodiments of the present disclosure provide for a reduction in the cost and complexity of forming epitaxial source/drain regions. In addition, the simplified process of forming epitaxial source/drain regions disclosed herein is accomplished with the deposition and removal of fewer masking layers (e.g., such as dielectric isolation layers), for example as compared to at least some existing processes, which provides for reduced epitaxial layer loss.

Thus, one of the embodiments of the present disclosure described a method where a substrate including a plurality of fins extending from the substrate is provided. In some embodiments, a liner layer is formed over the plurality of fins. The liner layer is patterned to expose a first group of fins of the plurality of fins in a first region. In some embodiments, a first epitaxial layer is formed over the exposed first group of fins and a barrier layer is formed over the first epitaxial layer. Thereafter, the patterned liner layer may be removed. In various examples, a second epitaxial layer is selectively formed over a second group of fins of the plurality of fins in a second region.

In another of the embodiments, discussed is a method of fabricating a semiconductor device including forming a first group of fins in an N-type region, a second group of fins in a P-type region, a first hybrid fin interposing adjacent fins of the second group of fins, and a second hybrid fin at a boundary between the N-type region and the P-type region. In some embodiments, the method further includes forming a patterned dielectric isolation layer over the second group of fins, the first hybrid fin, and at least partially over the second hybrid fin. By way of example, an epitaxial N-type source/drain structure may be grown over the first group of fins in the N-type region and a barrier layer may be formed over the epitaxial N-type source/drain structure. The patterned dielectric isolation layer may then be removed, and an epitaxial P-type source/drain structure may be selectively grown over the second group of fins in the P-type region.

In yet another of the embodiments, discussed is a semiconductor device including a substrate having an N-type region including a first group of fins and a P-type region including a second group of fins. In some embodiments, the semiconductor device further includes an epitaxial N-type source/drain structure disposed over the first group of fins in the N-type region, and an epitaxial P-type source/drain structure disposed over the second group of fins in the P-type region. In some embodiments, a first shallow trench isolation (STI) region in the N-type region is lower than a second STI region in the P-type region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate including a plurality of fins extending from the substrate, wherein the plurality of fins includes a first group of fins in a first substrate region and a second group of fins in a second substrate region;
   a first epitaxial layer disposed over each fin of the first group of fins;
   a second epitaxial layer disposed over each fin of the second group of fins; and
   a hybrid fin interposing adjacent fins of the second group of fins.

2. The semiconductor device of claim 1, wherein the first substrate region includes an N-type region, and wherein the first epitaxial layer includes an epitaxial N-type source/drain structure.

3. The semiconductor device of claim 1, wherein the second substrate region includes a P-type region, and wherein the second epitaxial layer includes an epitaxial P-type source/drain structure.

4. The semiconductor device of claim 1, wherein the first epitaxial layer includes a SiP layer, a SiCP layer, a SiAs layer, or a combination thereof.

5. The semiconductor device of claim 1, wherein the second epitaxial layer includes a SiGe layer, a Ge layer, a boron doped SiGe layer (SiGe:B), or a combination thereof.

6. The semiconductor device of claim 1, further comprising another hybrid fin disposed at a boundary between the first substrate region and the second substrate region.

7. The semiconductor device of claim 1, wherein the hybrid fin includes a bi-layer dielectric material.

8. The semiconductor device of claim 1, wherein a first plane defined by a first top surface of the hybrid fin is disposed above a second plane defined by a second top surface of the plurality of fins.

9. The semiconductor device of claim 1, wherein a first isolation region in the first substrate region is disposed at a lower height than a second isolation region in the second substrate region.

10. A semiconductor device, comprising:
    a first group of fins in an N-type region;
    a second group of fins in a P-type region;
    a first hybrid fin interposing adjacent fins of the second group of fins;
    a second hybrid fin disposed at a boundary between the N-type region and the P-type region;

an epitaxial N-type source/drain structure disposed over each fin of the first group of fins in the N-type region; and an epitaxial P-type source/drain structure disposed over each fin of the second group of fins in the P-type region.

11. The semiconductor device of claim 10, further comprising a first shallow trench isolation (STI) region in the N-type region and a second STI region in the P-type region, wherein a first top surface of the first STI region is lower than a second top surface of the second STI region.

12. The semiconductor device of claim 11, wherein the epitaxial N-type source/drain structure is separated a distance from the first STI region, and wherein the epitaxial P-type source/drain structure contacts the second STI region.

13. The semiconductor device of claim 10, wherein adjacent epitaxial N-type source/drain structures formed on adjacent fins of the first group of fins are merged.

14. The semiconductor device of claim 10, wherein adjacent epitaxial P-type source/drain structures formed on adjacent fins of the second group of fins are separated by the first hybrid fin.

15. The semiconductor device of claim 10, wherein the second hybrid fin separates the epitaxial N-type source/drain structure on a first side of the boundary from the P-type source/drain structure on a second side of the boundary.

16. The semiconductor device of claim 10, wherein the epitaxial N-type source/drain structure is smaller than the epitaxial P-type source/drain structure.

17. The semiconductor device of claim 10, wherein a first plane defined by top surfaces of the first hybrid fin and the second hybrid fin is disposed above a second plane defined by top surfaces of the first group of fins and the second group of fins.

18. A semiconductor device, comprising:
a substrate including an N-type region having a first group of fins and a P-type region having a second group of fins;
an epitaxial N-type source/drain structure disposed over the first group of fins in the N-type region; and
an epitaxial P-type source/drain structure disposed over the second group of fins in the P-type region;
wherein a first shallow trench isolation (STI) region in the N-type region is lower than a second STI region in the P-type region.

19. The semiconductor device of claim 18, further comprising:
a first hybrid fin interposing adjacent fins of the second group of fins.

20. The semiconductor device of claim 19, further comprising:
a second hybrid fin disposed at a boundary between the N-type region and the P-type region.

* * * * *